US008013442B2

(12) United States Patent
Amatatsu et al.

(10) Patent No.: US 8,013,442 B2
(45) Date of Patent: Sep. 6, 2011

(54) SEMICONDUCTOR DEVICE AND MANUFACTURING METHOD THEREOF

(75) Inventors: Yoshimasa Amatatsu, Gunma (JP); Minoru Akaishi, Gunma (JP); Satoshi Onai, Gunma (JP); Katsuya Okabe, Gunma (JP); Yoshiaki Sano, Tochigi (JP); Akira Yamane, Gunma (JP)

(73) Assignees: Semiconductor Components Industries, LLC, Phoenix, AZ (US); Sanyo Semiconductor Co., Ltd., Gunma (JP)

( * ) Notice: Subject to any disclaimer, the term of this patent is extended or adjusted under 35 U.S.C. 154(b) by 562 days.

(21) Appl. No.: 12/053,168

(22) Filed: Mar. 21, 2008

(65) Prior Publication Data

US 2008/0230899 A1  Sep. 25, 2008

(30) Foreign Application Priority Data

Mar. 23, 2007  (JP) .................. 2007-076845

(51) Int. Cl.
*H01L 23/48* (2006.01)
(52) U.S. Cl. .................. 257/737; 257/E23.021
(58) Field of Classification Search .......... 257/737–738, 257/734, 750–751, 780–781, E23.021, E23.017
See application file for complete search history.

(56) References Cited

U.S. PATENT DOCUMENTS

| 5,641,703 | A | 6/1997 | Cohen et al. |
|---|---|---|---|
| 5,859,476 | A | 1/1999 | Onoda |
| 6,297,563 | B1 | 10/2001 | Yamaha |
| 6,434,819 | B1 * | 8/2002 | Rokugawa ............... 29/852 |
| 6,455,940 | B2 | 9/2002 | Satou |
| 6,500,750 | B1 | 12/2002 | Shroff et al. |
| 6,927,493 | B2 | 8/2005 | Bojkov et al. |
| 7,307,342 | B2 * | 12/2007 | Jeong et al. ............. 257/750 |
| 7,545,040 | B2 | 6/2009 | Ueki et al. |
| 7,598,612 | B2 * | 10/2009 | Yuzawa ............. 257/737 |
| 2008/0001290 | A1 | 1/2008 | Chou et al. |
| 2008/0237853 | A1 | 10/2008 | Amatatsu et al. |
| 2008/0258301 | A1 | 10/2008 | Amatatsu et al. |

FOREIGN PATENT DOCUMENTS

| JP | 9-219450 | 8/1997 |
|---|---|---|
| JP | 11-145171 | 5/1999 |

OTHER PUBLICATIONS

Amatatsu, et al., U.S. Office Action mailed Oct. 28, 2010, directed to U.S. Appl. No. 12/056,751; 7 pages.
Amatatsu, Y. et al., U.S. Office Action mailed Mar. 18, 2011, directed to U.S. Appl. No. 12/056,751; 7 pages.
Amatatsu, Y. et al., U.S. Office Action mailed Mar. 22, 2011, directed to U.S. Appl. No. 12/081,487; 9 pages.

* cited by examiner

*Primary Examiner* — Hoa B Trinh
(74) *Attorney, Agent, or Firm* — Morrison & Foerster LLP

(57) ABSTRACT

In a semiconductor device according to the present invention, a plurality of opening regions 5 to 8 are formed in an insulating film on a pad electrode 3. A metal layer 9 formed on the pad electrode 3 has a plurality of concave portions 10 to 13 formed therein by covering the opening regions 5 to 8. Moreover, in a peripheral portion at a bottom of each of the concave portions 10 to 13 in the metal layer 9, the metal layer 9 and a Cu plating layer 19 react with each other. By use of this structure, the metal reaction area serves as a current path on the pad electrode 3. Thus, a resistance value on the pad electrode 3 is reduced.

12 Claims, 12 Drawing Sheets

(A)

(B)

(A)

(B)

(A)

(B)

45 43 44 46 41 47 48

43 41

(A)

(B)

(C)

(D)

(E)

(F)

US 8,013,442 B2

SEMICONDUCTOR DEVICE AND MANUFACTURING METHOD THEREOF

This application claims priority from Japanese Patent Application Number JP 2007-076845 filed on Mar. 23, 2007, the content of which is incorporated herein by reference in its entirety.

BACKGROUND OF THE INVENTION

1. Field of the Invention

The present invention relates to a semiconductor device for reducing a resistance value in a pad electrode formation part, and a manufacturing method thereof.

2. Description of the Related Art

As an example of a conventional method for manufacturing a semiconductor device, the following manufacturing method as shown in FIGS. 18A to 18F has been known. As shown in FIG. 18A, an interlayer insulating film 92 made of silicon dioxide or the like is formed on a surface of a silicon substrate 91. Next, as shown in FIG. 18B, an aluminum (Al) electrode pad 93 having a thickness of about 1.0 (μm) is formed on the interlayer insulating film 92. Thereafter, as shown in FIG. 18C, a silicon nitride film 94 is formed on the Al electrode pad 93 and the interlayer insulating film 92 by use of a CVD (chemical vapor deposition) method. Subsequently, as shown in FIG. 18D, an opening 95 is formed in the silicon nitride film 94 on the Al electrode pad 93. Next, as shown in FIG. 18E, a barrier metal film 96 is formed so as to cover the Al electrode pad 93 exposed from the opening 95. Thereafter, as shown in FIG. 18F, a gold bump 97 is formed on the barrier metal film 96 by use of an electrolytic plating method. This technology is described for instance in Japanese Patent Application Publication No. Hei 11-145171 (Pages 2 and 3, FIG. 1).

As described above, in the conventional method for manufacturing a semiconductor device, after the Al electrode pad 93 is formed on the interlayer insulating film 92, the silicon nitride film 94 as a passivation film is formed on the Al electrode pad 93. After the opening 95 is formed in the silicon nitride film 94 on the Al electrode pad 93, the barrier metal film 96 is formed on the exposed Al electrode pad 93 by use of a sputtering method, for example. According to this manufacturing method, in the step of forming the opening 95 in the silicon nitride film 94 and forming the barrier metal film 96 therein, the Al electrode pad 93 exposed from the opening 95 is oxidized to form an oxide film on the Al electrode pad 93. Thus, a current path on the Al electrode pad 93 is from the Al electrode pad 93 to the gold bump 97 through the oxide film on the Al electrode pad 93 and the barrier metal film 96. As a result, there is a problem that the oxide film formed on the current path makes it difficult to reduce a resistance value on the Al electrode pad 93.

SUMMARY OF THE INVENTION

The present invention was made in consideration of the foregoing circumstances. A semiconductor device according to the present invention includes a pad electrode provided on an insulated surface of a semiconductor substrate, an insulating layer formed so as to cover the pad electrode, a plurality of opening regions provided in the insulating layer so as to expose a surface of the pad electrode, a metal layer which is formed on a surface of the insulating layer as well as in the opening regions, is connected to the pad electrode, and has a plurality of concave portions formed in the opening regions, a plating metal layer which is formed on the metal layer as well as in the concave portions, and an electrode formed on the plating metal layer. In the semiconductor device, the plating metal layer formed in the concave portions has an area formed to be thinner than that in the other area. In the thinly formed area, an alloy layer including at least a metal included in the metal layer and a metal included in the electrode is generated. Therefore, in the present invention, a metal layer having unevenness is formed on the pad electrode. By use of this structure, a resistance value on the pad electrode is reduced by utilizing step coverage in the concave portions of the metal layer.

DESCRIPTION OF THE INVENTIONS

Figure 1:
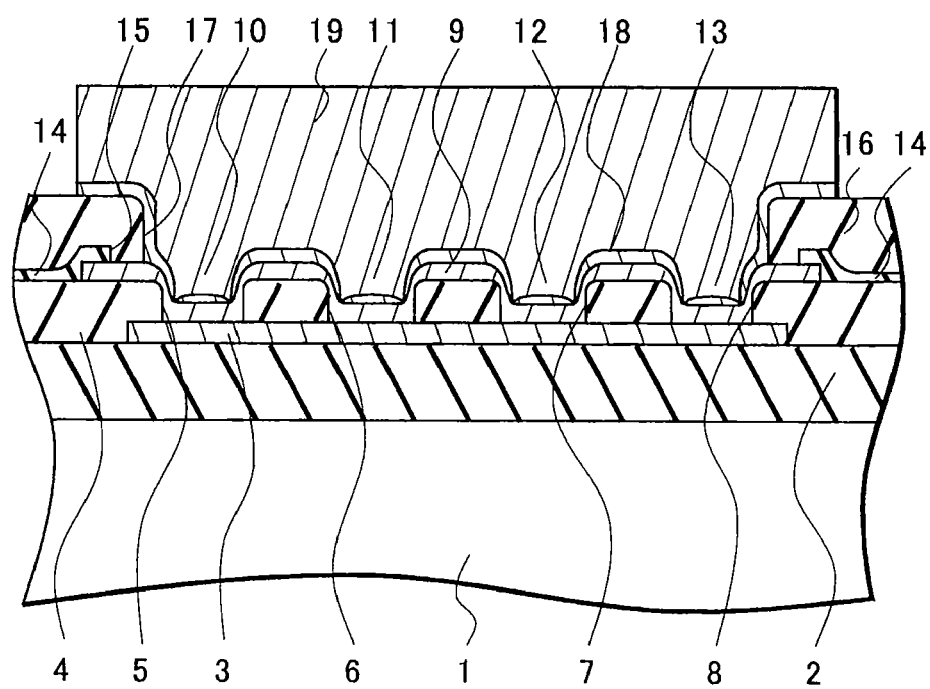
FIGS. 1A and 1B are cross-sectional views showing a semiconductor device according to an embodiment of the present invention.
Figure 1:
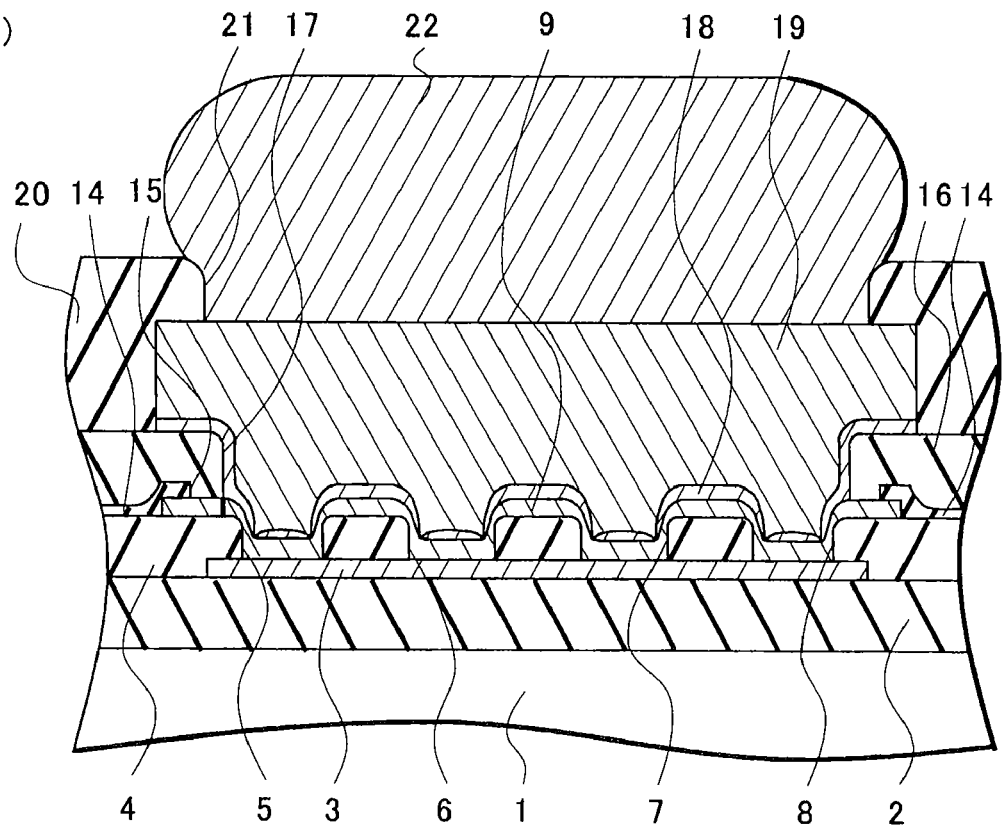
Figure 2:
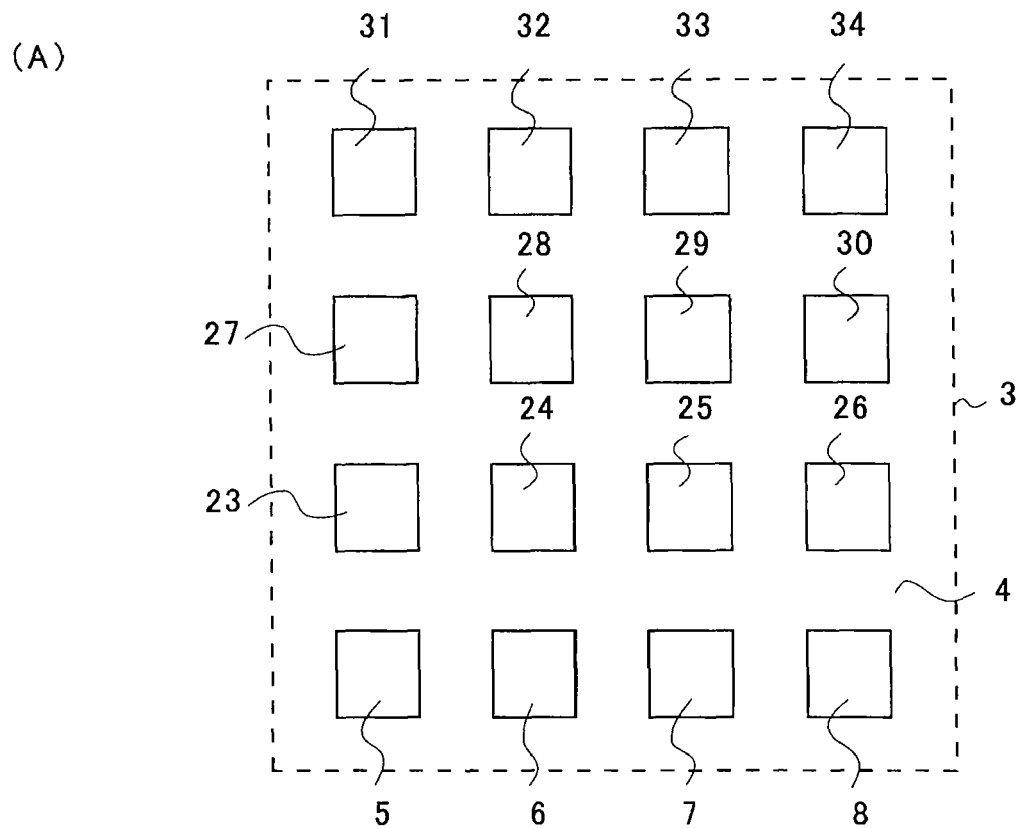
FIG. 2A is a plan view and FIG. 2B is a cross-sectional view showing the semiconductor device according to the embodiment of the present invention.
Figure 2:
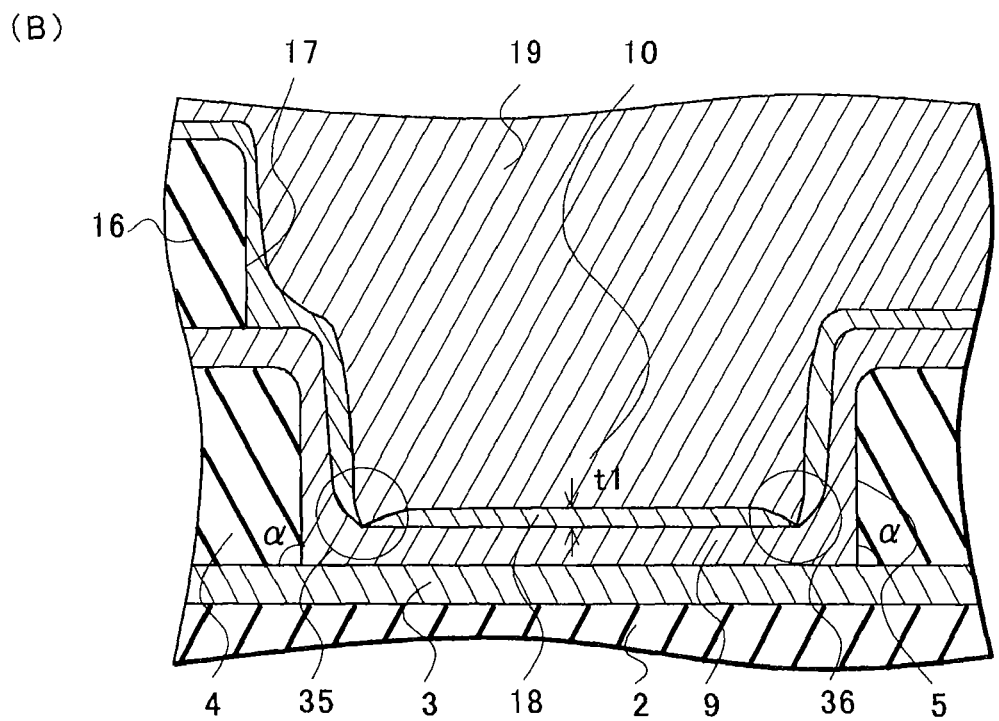
Figure 3:
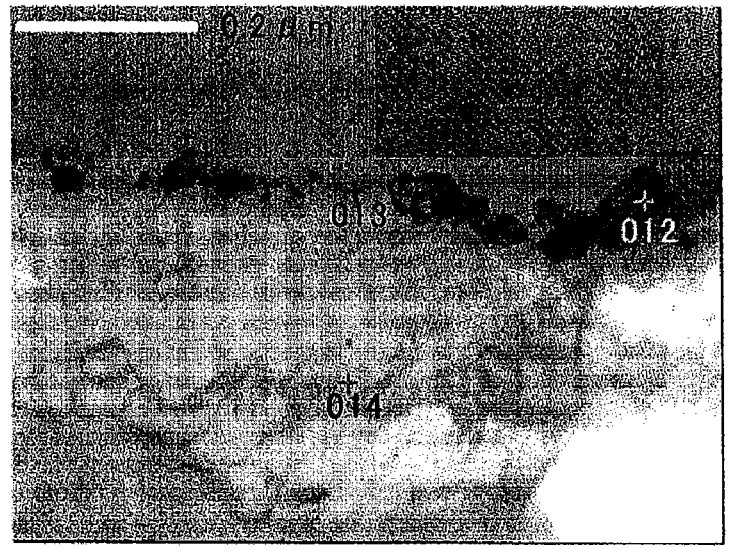
FIG. 3A is an analysis picture of TEM for explaining a region that reacts with metal and FIG. 3B is an analysis picture of TEM for explaining a region that does not react with metal in the semiconductor device according to the embodiment of the present invention.
Figure 3:
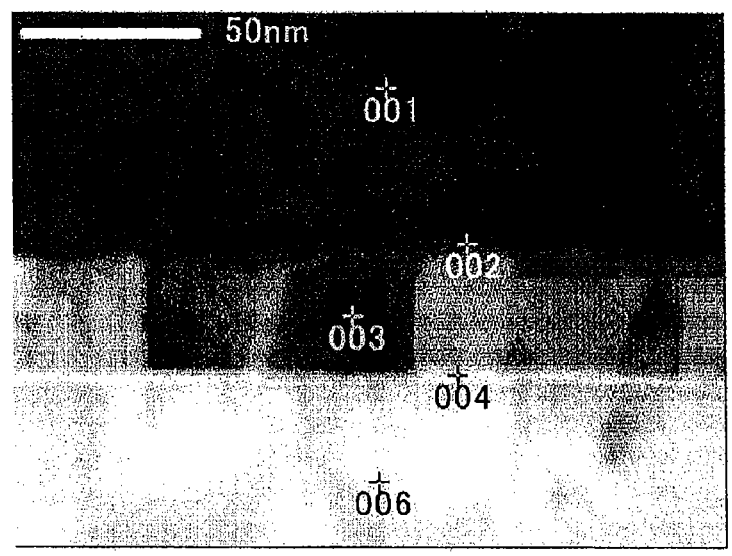
Figure 4:
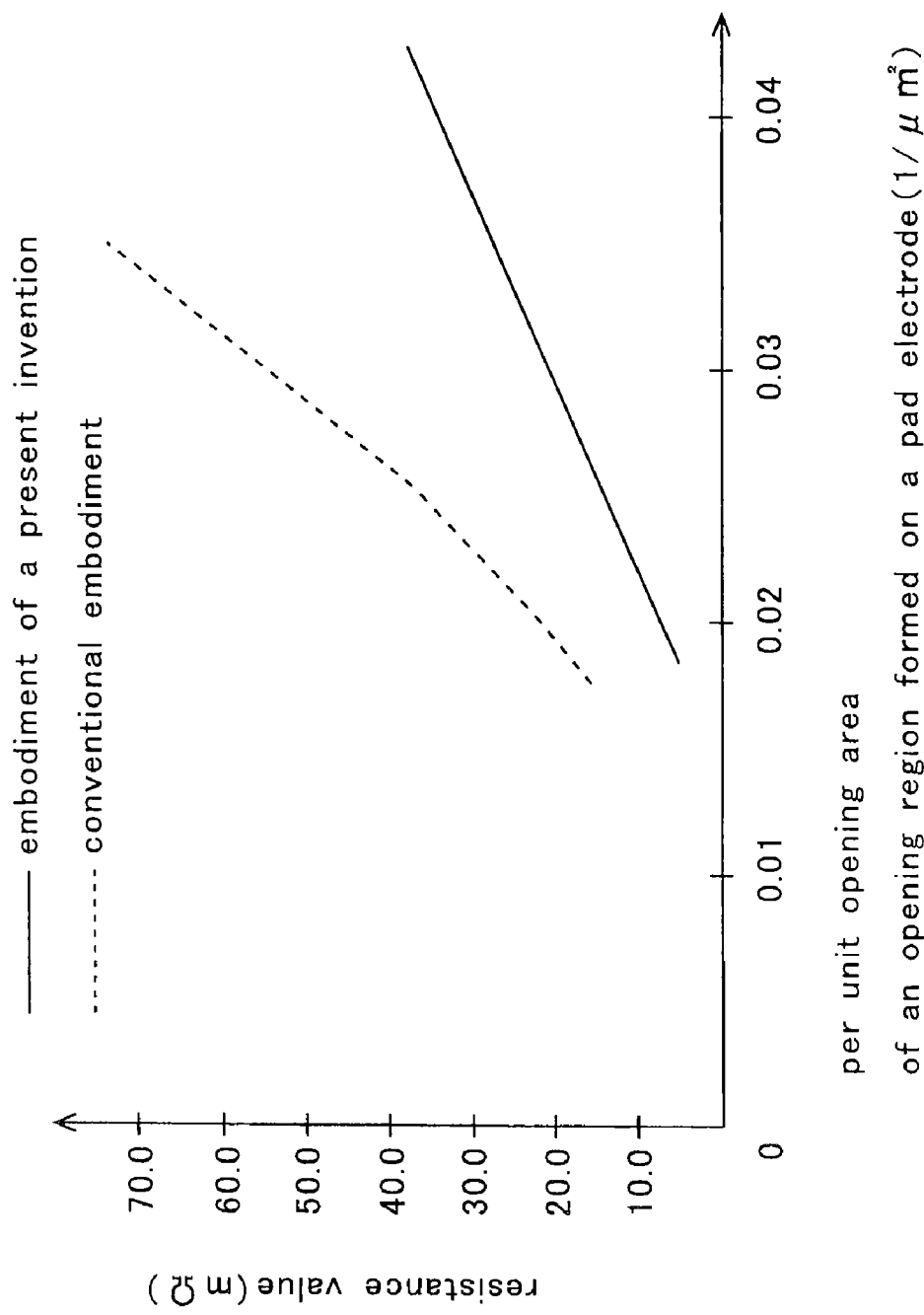
FIG. 4 is a graph for explaining a resistance value on a pad electrode in the semiconductor device according to the embodiment of the present invention.

With reference to FIGS. 1 to 4, a semiconductor device according to a first embodiment of the present invention will be described in detail below. FIG. 1A is a cross-sectional view showing the semiconductor device according to this embodiment. FIG. 1B is a cross-sectional view showing the semiconductor device according to this embodiment. FIG. 2A is a plan view showing a structure on a pad electrode in the semiconductor device according to this embodiment. FIG. 2B is a cross-sectional view showing the structure on the pad electrode in the semiconductor device according to this embodiment. FIG. 3A is an analysis picture of TEM for explaining a region that reacts with metal on the pad electrode. FIG. 3B is an analysis picture of TEM for explaining a region that does not react with metal on the pad electrode. FIG. 4 is a graph for explaining a resistance value between the pad electrode and a plating layer immediately above the pad electrode in the semiconductor device according to this embodiment.

As shown in FIG. 1A, a first insulating layer 2 is formed on a silicon substrate 1. The first insulating layer 2 is formed of at least, for example, a silicon oxide film, or a NSG (Non-doped Silicate Glass) film, or a BPSG (Boron Phospho Silicate Glass) film and the like. Note that, by forming the first insulating layer 2 on the silicon substrate 1, the silicon substrate 1 is insulated on its surface. Moreover, examples of the silicon substrate 1 include one made of a single crystal substrate and one having an epitaxial layer formed on a single crystal substrate. Furthermore, a compound semiconductor substrate may be used as the silicon substrate 1.

Thereafter, a pad electrode 3 is formed on the first insulating layer 2. The pad electrode 3 is formed of an aluminum layer or an alloy layer mainly made of aluminum (Al), which is selected from, for example, an aluminum-silicon (Al—Si) film, or an aluminum-silicon-copper (Al—Si—Cu) film, or an aluminum-copper (Al—Cu) film, and the like. The pad electrode 3 has a thickness of, for example, 0.4 to 3.0 (µm).

Moreover, a second insulating layer 4 is formed on the first insulating layer 2 and also on the pad electrode 3. This second insulating layer 4 is formed of at least a silicon oxide film, or a TEOS (Tetra-Ethyl-Ortho-Silicate) film, and the like.

Subsequently, opening regions 5 to 8 are formed in the second insulating layer 4. The opening regions 5 to 8 are formed in the second insulating layer 4 by dry etching using $CHF_3$ or $CF_4$ gas, for example, by use of a photolithography technology. Moreover, the opening regions 5 to 8 are formed in the second insulating layer 4 on the pad electrode 3 so as to form a checkered pattern, for example, on a formation region of the pad electrode 3. Here, the checkered pattern means a pattern as if the opening regions 5 to 8 and 23 to 34 are positioned as islands and arranged in a matrix form, as shown in FIG. 2A. Moreover, the second insulating layer 4 is formed in a lattice pattern so as to surround the opening regions 5 to 8 and 23 to 34.

Subsequently, a metal layer 9 is formed on the second insulating layer 4 as well as in the opening regions 5 to 8. The metal layer 9 is formed of an aluminum layer or an alloy layer mainly made of Al, which layer is formed of at least, for example, an Al—Si film, or an Al—Si—Cu film, or an Al—Cu film, and the like. Moreover, in formation regions of the opening regions 5 to 8, the metal layer 9 is directly connected to the pad electrode 3. Note that the metal layer 9 is disposed so as to cover at least the formation region of the pad electrode 3.

In other words, since the metal layer 9 is formed on unevenness of the second insulating layer 4, concave portions 10 to 13 look like they are formed in the metal layer 9. The metal layer 9 is formed by use of a sputtering method, for example, and covers insides of the opening regions 5 to 8 formed in the second insulating layer 4. With this structure, the metal layer 9 is formed into an uneven shape so that arrangement areas of the opening regions 5 to 8 serve as the concave portions 10 to 13.

Thereafter, a shield layer 14 is formed on the second insulating layer 4 and on a part of the metal layer 9. The shield layer 14 is formed of a silicon nitride (SiN) film. The shield layer 14 can prevent corrosion of a wiring layer and the like by preventing moisture from entering into the second insulating layer 4. Moreover, in the formation region of the pad electrode 3, an opening 15 is formed by removing the shield layer 14 on the formation region of the pad electrode 3. Thus, the metal layer 9 is exposed from the opening 15.

Subsequently, a spin-coated resin film 16 is formed on the shield layer 14. The spin-coated resin film 16 is an insulating layer and, for example, a polybenzoxazole (PBO) film, a polyimide resin film or the like is used. Moreover, the PBO film is a photosensitive resin film having properties such as high heat resistance, a high mechanical property and a low-dielectric property. Furthermore, the PBO film can stabilize a surface of a semiconductor element by preventing the semiconductor element from being deteriorated by an external environment such as moisture.

An opening 17 is formed in the spin-coated resin film 16 on the formation region of the pad electrode 3 described above. This opening 17 is formed by wet etching, for example, by use of the photolithography technology. Moreover, the opening 17 has a wide open shape so as to expose the opening regions 5 to 8.

Subsequently, a plating metal layer 18 is formed on the spin-coated resin film 16 as well as in the opening 17.

As the plating metal layer 18, two types of films are provided by lamination. A first film is a high-melting metal film, such as a chromium (Cr) layer, a titanium (Ti) layer or a titanium-tungsten (TiW) layer, and is formed by use of the sputtering method. The first film is used as a seed layer in formation of a plating layer on the plating metal layer 18. Furthermore, as a second film, a copper (Cu) layer or a nickel (Ni) layer is formed on the first film by use of the sputtering method, for example. The second film is used as a seed in formation of the plating layer on the plating metal layer 18. When the PBO film is used as the spin-coated resin film 16, use of the Cr layer, for example, as the plating metal layer 18 allows improvement in adhesion between the PBO film and a Cu plating layer 19, resulting from adhesion between the PBO film and the Cr layer and adhesion between the Cr layer and the Cu plating layer 19.

Subsequently, the Cu plating layer 19 is formed on the plating metal layer 18 by use of, for example, an electrolytic plating method. In the case of forming the Cu plating layer 19, the Cu layer is used as the plating metal layer 18.

Meanwhile, when a gold (Au) plating layer is formed instead of the Cu plating layer 19, the Ni layer is used, instead of the Cu layer, as the plating metal layer 18. Note that FIG. 1A shows the case where the Cu layer is formed as the plating metal layer 18 and the Cu plating layer 19 is formed on the Cu layer. Thus, the electrolytic plating method allows the Cu layer as the plating metal layer 18 to be substantially replaced by the Cu plating layer 19. Therefore, the Cu layer is shown as being integrated with the Cu plating layer 19. Moreover, instead of the Cu plating layer 19, a bump electrode made of Au or solder, for example, may be formed on the plating metal layer 18.

FIG. 1B shows a structure obtained by forming the bump electrode in the structure shown in FIG. 1A. Therefore, the same constituent components are denoted by the same reference numerals and only the constituent components different from those shown in FIG. 1A will be described. Thus, description of the same constituent components will be omitted.

As shown in FIG. 1B, first, a PBO film 20 is formed on the surface of the structure shown in FIG. 1A. Thereafter, an opening 21 is formed in the PBO film 20 on the Cu plating layer 19, and a part of the Cu plating layer 19 is exposed from the opening 21.

Subsequently, a bump electrode 22 is formed so as to be connected to the Cu plating layer 19 through the opening 21. The bump electrode 22 is formed by depositing, for example, Cu, Au and solder in this order from the bottom.

In the structure shown in FIG. 1B, the Cu plating layer 19 may be used as a wiring layer electrically connected to an element formation region from this portion. Moreover, use of the Cu plating layer 19 as a Cu wiring layer allows reduction in a wiring resistance value, compared with the case of an Al wiring layer. To be more specific, a sheet resistance value of the Cu wiring layer is about 2.0 ($\mu\Omega\cdot$cm) and a sheet resistance value of the Al wiring layer is about 3.0 ($\mu\Omega\cdot$cm). Furthermore, the Cu plating layer 19 as the wiring layer is formed to have a thickness of about 10.0 ($\mu$m) by use of the electrolytic plating method. Meanwhile, the Al wiring layer is formed to have a thickness of about 2.0 to 3.0 ($\mu$m) by use of the sputtering method. Specifically, by using the Cu plating layer 19 as the wiring layer, the thickness thereof also allows reduction in the wiring resistance value.

Note that FIG. 1B shows the case where the opening 21 is formed on the formation region of the pad electrode 3. This embodiment of the present invention is not limited to this case. This embodiment of the present invention may also be applied to the case where the Cu plating layer 19 is used as the wiring layer as described above, is extended to an arbitrary region and is connected to the bump electrode. In this case, by using the Cu plating layer 19, instead of the Al wiring layer, as the Cu wiring layer, the wiring resistance value is reduced.

FIG. 2A shows the plurality of opening regions formed in the second insulating layer 4 on the pad electrode 3. As shown in FIG. 2A, a dotted line indicates the formation region of the pad electrode 3 and solid lines indicate the opening regions 5 to 8 and 23 to 34 formed in the second insulating layer 4.

As described above, the opening regions 5 to 8 and 23 to 34 are positioned as islands and arranged in a matrix form when planarly viewed as shown in FIG. 2A. Moreover, the second insulating layer 4 is formed in a lattice pattern so as to surround the opening regions 5 to 8 and 23 to 34.

In the second insulating layer 4 on the pad electrode 3, sixteen opening regions 5 to 8 and 23 to 34 are formed so as to be equally spaced apart from each other. As a size of each of the opening regions 5 to 8 and 23 to 34, each has a square shape with a length of 0.5 to 20.0 ($\mu$m) on each side, for example. As described above, the second insulating layer 4 is formed of an inorganic insulating film such as a silicon oxide film. Thus, microfabrication by dry etching can be performed. Therefore, each of the opening regions 5 to 8 and 23 to 34 is small in size and formed into a precipitous shape. This is the point of this embodiment of the present invention as described later. Note that each of the opening regions 5 to 8 and 23 to 34 does not always have to have the square shape but may have various shapes such as a triangular shape and a circular shape.

FIG. 2B shows a state of connection among the pad electrode 3, the metal layer 9, the plating metal layer 18 and the Cu plating layer 19 in the opening region 5. In the opening region 5, the pad electrode 3 is partially exposed from the second insulating layer 4, and the exposed pad electrode 3 is connected to the metal layer 9. The metal layer 9 is formed on side surfaces of the second insulating layer 4, the side surfaces being positioned in the opening region 5, and on a surface of the pad electrode 3 exposed through the opening region 5. Moreover, the plating metal layer 18 is formed on a surface of the metal layer 9 exposed through the opening 17 formed in the spin-coated resin film 16. In this event, the opening region 5 is formed in such a manner that an angle $\alpha$ formed by the surface of the pad electrode 3 and each of the side surfaces of the second insulating layer 4 is set to, for example, 70° to 90°. Moreover, the metal layer 9 is formed on the surface of the second insulating layer 4 by use of the sputtering method, for example. Thus, the metal layer 9 has unevenness corresponding to the shape of the opening region 5. The concave portion 10 formed in the metal layer 9 is smaller in opening area than the opening region 5 and thus has poor step coverage. Furthermore, the Cr layer that forms the plating metal layer 18 is formed by use of the sputtering method.

One feature of this embodiment is a deposition state in areas indicated by circles 35 and 36, more specifically, in a peripheral portion of the metal layer 9 positioned at the bottom of the concave portion 10 and in areas adjacent thereto. In other words, in a boundary area between an inner wall of the concave portion 10 and the bottom thereof, the Cr layer that forms the plating metal layer 18 exists while being reduced in thickness. By utilizing the step coverage of the concave portion 10, the Cr layer is formed to have a smaller thickness in the areas indicated by the circles 35 and 36, compared with that in a central area of the bottom of the concave portion 10. In these areas, deposition of the Cr layer is difficult.

With the structure described above, the Cr layer 18 is thinner than a predetermined thickness t1 in the areas indicated by the circles 35 and 36 and becomes coarse in those areas. The Cu plating layer 19 in the concave portion 10 reacts with the metal layer 9 made of an Al layer or an Al alloy layer to form an alloy through the areas of thin Cr layer 18 at the bottom corners of the concave portion 10.

This alloy formation is shown in FIG. 3A. The area above the black area crossing the central area of the analysis picture of TEM, the area being indicated by a + mark 011, is the Cu plating layer 19. The black area crossing the central area of the analysis picture of TEM, which is indicated by a + mark 012, is the Cr layer 18. The area penetrating the Cr layer 18, indicated by a + mark 013, is the alloy layer. The area below the Cr layer 18, indicated by a + mark 014, is the metal layer 9.

The inventors believe that the Cr layer has coarse crystal grains at the thin portions 35 and 36, and the metals of the Cu plating layer 19 and the metal layer 9 flow between the coarse crystal grains in the Cr layer 18 to form an alloy. Moreover, the Cu plating layer 19 and the metal layer 9 are connected to each other by the alloy layer.

In this event, although not for sure, the oxide film formed on the surface of the metal layer 9 is slightly pushed to another area from the metal reaction area or is diffused and eliminated in the metal reaction. Specifically, the area where the metal reaction occurs and thus the alloy layer including Cu and Al is formed has a resistance lower than that in the area where the Cr layer exists between the Cu plating layer 19 and the metal layer 9.

Meanwhile, in the area where no metal reaction occurs, as shown in FIG. 3B, the black area above the area crossing the central area of the analysis picture of TEM in a striped pattern, indicated by a + mark 001, is the Cu plating layer 19. The area immediately above the area crossing the central area of the analysis picture of TEM in the striped pattern, indicated by a + mark 002, is a boundary area between the Cu plating layer 19 and the Cr layer 18. The area crossing the central area of the analysis picture of TEM in the striped pattern, indicated by a + mark 003, is the Cr layer 18. The area immediately below the area crossing the central area of the analysis picture of TEM in the striped pattern, indicated by a + mark 004, is a boundary area between the Cr layer 18 and the metal layer 9. The white area below the area crossing the central area of the analysis picture of TEM in the striped pattern, indicated by a + mark 006, is the metal layer 9.

FIG. 3B shows individual crystal grains of the Cr layer 18, i.e., the columns with different contrasts. Unlike the Cr layer 18 shown in FIG. 3A, this Cr layer 18 is dense state so that the crystal grains are in contact with each other. Thus, the Cu plating layer 19 and the metal layer 9 are separated by the dense Cr layer 18 without the alloy formation shown in FIG. 3A. Note that, in the area indicated by the + mark 004, the oxide film formed on the surface of the metal layer 9 is also observed.

Specifically, in the area where the Cr layer has the desired thickness t1 and the crystal grains in the Cr layer are dense, the oxide film on the surface of the metal layer 9 and the Cr layer allow resistance to be set higher than that in the area where the metal reaction occurs and the alloy layer exists.

Based on the experimental data described above, the inventors set forth the following explanations. Spaces between crystal grains in the Cr layer 18 at the thin portions 35 and 36 are widened to have portions with crystal grains and portions with no crystal grains. It is not clear yet whether the portions with no crystal grains are actually void spaces or made of some sort of stretched grain boundaries. Through these "portions with no crystal grains," the Cu plating layer 19 in the concave portion 10 reacts with the metal layer 9 made of an Al layer or an Al alloy layer.

It is also believed that the crystal grains in the Cr layer are not in close contact with each other, so that spaces between the crystal grains are widened. Moreover, a subsequent step of heat treatment, for example, heat treatment in formation of the bump electrode allows the Cu plating layer 19 and the metal layer 9, which are formed above and below the Cr layer, to flow between the crystal grains and to react with each other in the area having coarse crystal grains in the Cr layer 18. In the metal reaction area, an alloy layer including Cu and Al is formed.

The formation of the concave portion 10, which has a small opening area and poor step coverage, in the metal layer 9 on the pad electrode 3 enables an increase in the area where the alloy layer is formed by metal reaction at the bottom of the concave portion 10. The area where the alloy layer is formed by the metal reaction serves as a current path. Thus, a resistance value between the pad electrode 3 and the Cu plating layer 19 is reduced. Furthermore, the plurality of concave portions are formed in the metal layer 9 on the pad electrode 3 by forming the plurality of opening regions 5 to 8 and 23 to 34 in the second insulating layer 4 as shown in FIG. 2A. Moreover, a boundary length in the peripheral portion at the bottom of the concave portion in the metal layer 9 is increased in accordance with the opening shape of each of the opening regions 5 to 8 and 23 to 34 indicated by the solid lines. Accordingly, the probability of the presence of the alloy layer as indicated by the circles 35 and 36 is also increased. As a result, the current path that is the low-resistance area on the pad electrode 3 is increased. Thus, the resistance value between the pad electrode 3 and the Cu plating layer 19 is significantly reduced.

Here, the Cr layer that forms the plating metal layer 18 is used for improving the adhesion between the PBO film as the spin-coated resin film 16 and the Cu plating layer 19. Meanwhile, the Cr layer also serves as a seed layer for preventing excessive metal reaction between the Cu plating layer 19 and the metal layer 9. The Cr layer is used as the seed layer because of the following reason. Specifically, the Cu plating layer 19 and the metal layer (Al layer or Al alloy layer) 9 have affinities for each other and easily react with each other. Thus, property fluctuations such as a change in the resistance value due to excessive metal reaction of the both metal layers are prevented.

Particularly, although the metal reaction between the Cu plating layer 19 and the metal layer (Al layer or Al alloy layer) 9 is progressed by adding heat treatment, the Cr layer is used as the seed layer in order to prevent progressive property fluctuations due to heating in a subsequent step. Note that, in the peripheral portion at the bottom of the concave portion in the metal layer and in areas adjacent thereto, the metal reaction area is minute. Thus, there is no influence on the progressive property fluctuations or the progressive property fluctuations can be suppressed.

FIG. 4 shows a resistance value, between the pad electrode and the plating layer immediately above the pad electrode, per unit opening area of the opening region formed on the pad electrode 3. A solid line indicates a resistance value per unit opening area in this embodiment, and a dotted line indicates a resistance value per unit opening area in a conventional embodiment. Note that, in FIG. 4, comparison is made between resistance values in the case where one opening region is formed in the insulating layer on the pad electrode.

Figure 18:
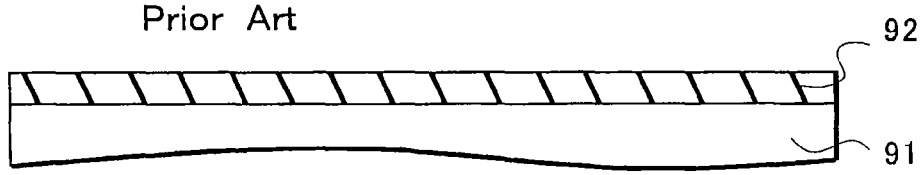
FIGS. 18A to 18F are cross-sectional views showing a method for manufacturing a semiconductor device according to a conventional embodiment.
Figure 18:
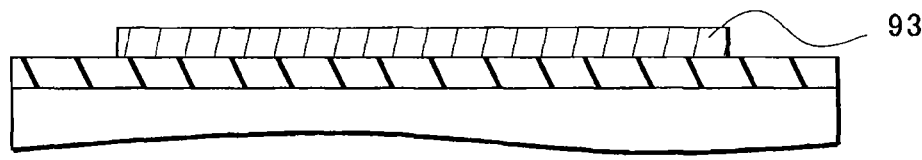
Figure 18:
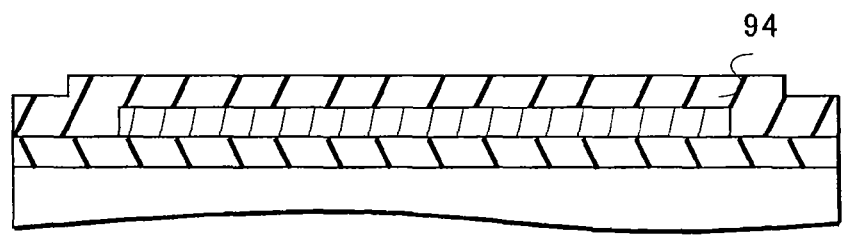
Figure 18:
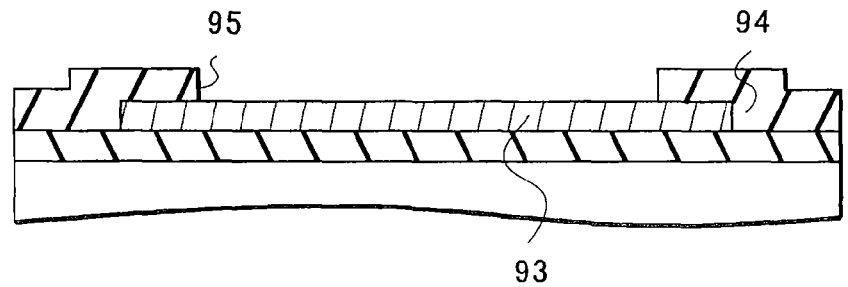
Figure 18:
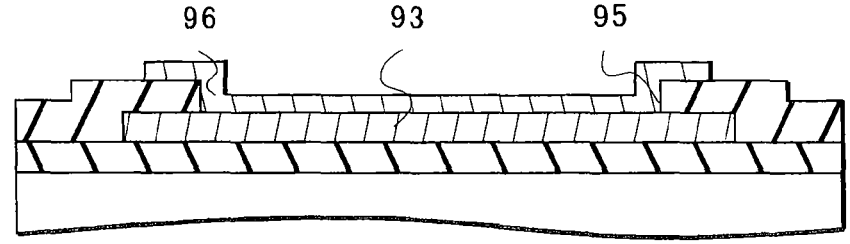
Figure 18:
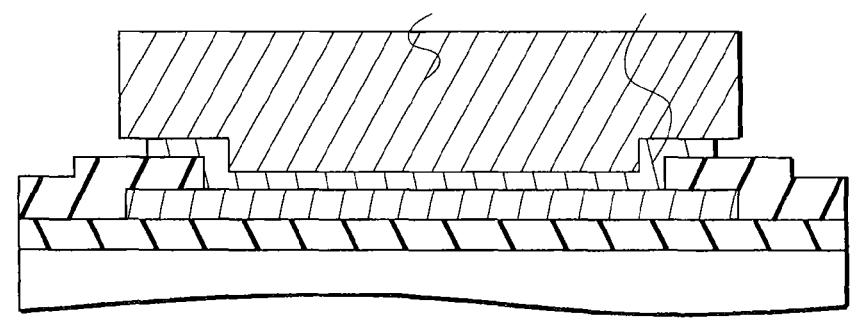

To be more specific, the solid line indicates a resistance value per unit opening area in the structure in which the metal layer, the plating metal layer and the Cu plating layer are laminated on the pad electrode as shown in FIG. 1A. Meanwhile, the dotted line indicates a resistance value per unit opening area in the structure in which the barrier metal film and the Cu plating layer are laminated on the pad electrode as shown in FIG. 18F. Note that, in FIG. 18F, the Au bump is formed on the barrier metal film. Meanwhile, FIG. 4 shows data about the structure in which the Au bump is replaced by the Cu plating layer having the same thickness as that in the case of the solid line.

As indicated by the solid line, for example, the resistance value is 6.5 (mΩ) when the unit opening area is 0.02 (1/μm$^2$), and the resistance value is 25.5 (mΩ) when the unit opening area is 0.033 (1/μm$^2$). Specifically, it is found out that the more the opening area of the opening region is increased, the more the resistance value is increased. This is because, as described above, the larger the opening area, the better the step coverage in the opening region, and the area in which the metal layer and the Cu plating layer react with each other is reduced in the peripheral portion at the bottom of the opening region.

Meanwhile, as indicated by the dotted line, for example, the resistance value is 22.3 (mΩ) when the unit opening area is 0.02 (1/μm$^2$), and the resistance value is 68.2 (mΩ) when the unit opening area is 0.033 (1/μm$^2$). Specifically, in the structure of this embodiment indicated by the solid line, the resistance value is reduced to about ⅓ of that in the structure of the conventional embodiment indicated by the dotted line.

This is because the area in which the metal layer and the Cu plating layer react with each other becomes a low-resistance area, and the area serves as a current path. Meanwhile, in the structure indicated by the dotted line, the resistance value is assumed to be increased since no metal reaction area is formed due to good step coverage of the opening region and also the oxide film formed between the pad electrode and the barrio metal film.

Note that, in this embodiment, the description was given of the case where the inorganic second insulating layer 4 such as a silicon oxide film is formed on the pad electrode 3 and the plurality of opening regions 5 to 8 and 23 to 34 are formed in the second insulating layer 4. However, the present invention is not limited to the above case. For example, the present invention may also be applied to the case where an organic insulating film, for example, a PBO film is used instead of the second insulating layer 4 and a plurality of opening regions are formed in the organic insulating film. Besides the above, various changes can be made without departing from the scope of the present invention.

Figure 5:
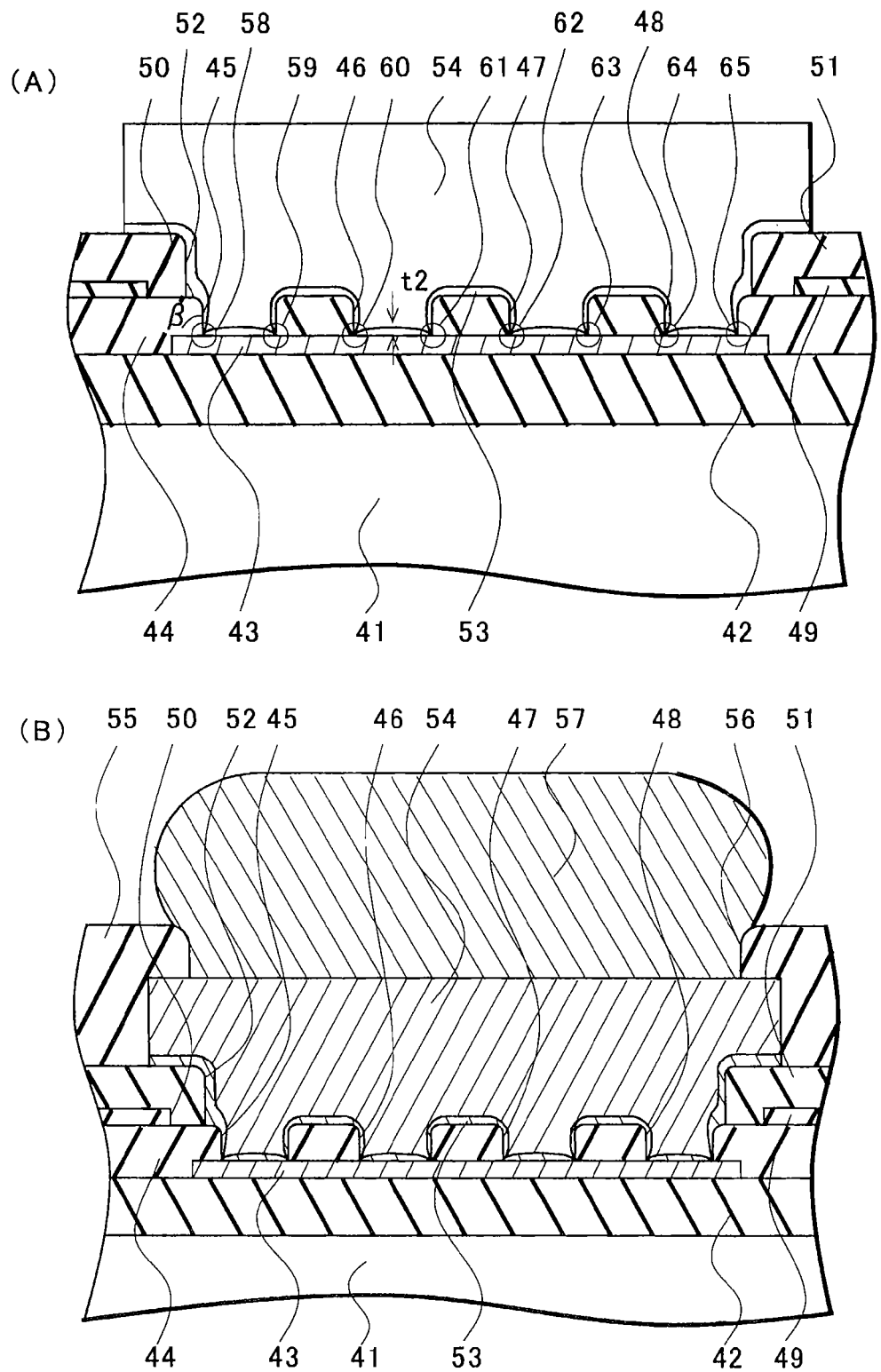
FIGS. 5A and 5B are cross-sectional views showing the semiconductor device according to the embodiment of the present invention.

Next, with reference to FIGS. 6A and 5B, a semiconductor device according to a second embodiment of the present invention will be described in detail. FIG. 5A is a cross-sectional view showing the semiconductor device according to this embodiment. FIG. 5B is a cross-sectional view showing the semiconductor device according to this embodiment. Note that, in description of this embodiment, FIGS. 1 to 4 used in the description of the first embodiment will be accordingly referred to.

As shown in FIG. 5A, a first insulating layer 42 is formed on a single crystal silicon substrate 41. The first insulating layer 42 is formed of at least, for example, a silicon oxide film, or a NSG film, or a BPSG film and the like. Note that, by forming the first insulating layer 42 on the silicon substrate 41, the silicon substrate 41 is insulated on its surface. Moreover, examples of the silicon substrate 41 include one made of a single crystal substrate and one having an epitaxial-layer formed on a single crystal substrate. Furthermore, a compound semiconductor substrate may be used as the silicon substrate 41.

Thereafter, a pad electrode 43 is formed on the first insulating layer 42. The pad electrode 43 is formed of Al layer or an alloy layer mainly made of Al, which is selected from, for example, an Al—Si film, or an Al—Si—Cu film, or an Al—Cu film, and the like. The pad electrode 43 has a thickness of, for example, 0.4 to 3.0 (μm).

Moreover, a second insulating layer 44 is formed on the first insulating layer 42 and also on the pad electrode 43. This second insulating layer 44 is formed of at least a silicon oxide film, or a TEOS film, and the like.

Subsequently, opening regions 45 to 48 are formed in the second insulating layer 44. The opening regions 45 to 48 are formed in the second insulating layer 44 by dry etching using $CHF_3$ or $CF_4$ gas, for example, by use of a photolithography technology. The opening regions 45 to 48 are formed in such a manner that an angle δ formed by the surface of the pad electrode 43 and each of the side surfaces of the second insulating layer 44 is set to, for example, 70 to 90 degrees. Moreover, the opening regions 45 to 48 are formed in the second insulating layer 44 on the pad electrode 43 so as to form a checkered pattern, for example, on a formation region of the pad electrode 43. Here, the checkered pattern means a pattern as if the opening regions 45 to 48 and the like are positioned as islands and arranged in a matrix form, as shown in FIG. 2A (not the same reference numerals). Moreover, the second insulating layer 44 is formed in a lattice pattern so as to surround the opening regions 45 to 48 and the like.

Thereafter, a shield layer 49 is formed on the second insulating layer 44. The shield layer 49 is formed of a SiN film. The shield layer 49 can prevent corrosion of a wiring layer and the like by preventing moisture from entering into the second insulating layer 44. Moreover, in the formation region of the pad electrode 43, an opening 50 is formed by removing the shield layer 49 on the formation region of the pad electrode 43. Thus, the pad electrode 43 is exposed from the opening 50 through the opening regions 45 to 48.

Subsequently, a spin-coated resin film 51 is formed on the shield layer 49. The spin-coated resin film 51 is an insulating layer and, for example, a polybenzoxazole (PBO) film, a polyimide resin film or the like is used. Moreover, the PBO film is a photosensitive resin film having properties such as high heat resistance, a high mechanical property and a low-dielectric property. Furthermore, the PBO film can stabilize a surface of a semiconductor element by preventing the semiconductor element from being deteriorated by an external environment such as moisture.

An opening 52 is formed in the spin-coated resin film 51 on the formation region of the pad electrode 43 described above. This opening 52 is formed by wet etching, for example, by use of the photolithography technology. Moreover, the opening 52 has a wide open shape so as to expose the opening regions 45 to 48.

Subsequently, a plating metal layer 53 is formed on the spin-coated resin film 51 as well as in the opening 52. In the opening 52, the plating metal layer 53 is formed on the second insulating layer 44 and on the pad electrode 43 exposed through the opening regions 45 to 48.

As the plating metal layer 53, two types of films are provided by lamination. A first film is a high-melting metal film, such as a Cr layer, a Ti layer or a TiW layer, and is formed by use of the sputtering method. The first film is used as a seed layer in formation of a plating layer on the plating metal layer 53. Furthermore, as a second film, a Cu layer or a Ni layer is formed on the first film by use of the sputtering method, for example. The second film is used as a seed in formation of the plating layer on the plating metal layer 53. When the PBO film is used as the spin-coated resin film 51, use of the Cr layer, for example, as the plating metal layer 53 allows improvement in adhesion between the PBO film and a Cu plating layer 54, resulting from adhesion between the PBO film and the Cr layer and adhesion between the Cr layer and the Cu plating layer 54.

Subsequently, the Cu plating layer 54 is formed on the plating metal layer 53 by use of, for example, an electrolytic plating method. In the case of forming the Cu plating layer 54, the Cu layer is used as the plating metal layer 53.

Meanwhile, when an Au plating layer is formed instead of the Cu plating layer 54, the Ni layer is used, instead of the Cu layer, as the plating metal layer 53.

Note that FIG. 5A shows the case where the Cu layer is formed as the plating metal layer 53 and the Cu plating layer 54 is formed on the Cu layer. Thus, the electrolytic plating method allows the Cu layer as the plating metal layer 53 to be substantially replaced by the Cu plating layer 54. Therefore, the Cu layer is shown as being integrated with the Cu plating layer 54. Moreover, instead of the Cu plating layer 54, a bump electrode made of Au or solder, for example, may be formed on the plating metal layer 53.

FIG. 5B shows a structure obtained by forming the bump electrode in the structure shown in FIG. 5A. Therefore, the same constituent components are denoted by the same reference numerals and only the constituent components different from those shown in FIG. 5A will be described. Thus, description of the same constituent components will be omitted.

As shown in FIG. 5B, first, a PBO film 55 is formed on the surface of the structure shown in FIG. 5A. Thereafter, an opening 56 is formed in the PBO film 55 on the Cu plating layer 54, and a part of the Cu plating layer 54 is exposed from the opening 56.

Subsequently, a bump electrode 57 is formed so as to be connected to the Cu plating layer 54 through the opening 56. The bump electrode 57 is formed by depositing, for example, Cu, Au and solder in this order from the bottom.

In the structure shown in FIG. 5B, the Cu plating layer 54 may be used as a wiring layer electrically connected to an element formation region from this portion. Moreover, use of the Cu plating layer 54 as a Cu wiring layer allows reduction in a wiring resistance value, compared with the case of an Al wiring layer. To be more specific, a sheet resistance value of the Cu wiring layer is about 2.0 ($\mu\Omega \cdot cm$) and a sheet resistance value of the Al wiring layer is about 3.0 ($\mu\Omega \cdot cm$). Furthermore, the Cu plating layer 54 as the wiring layer is formed to have a thickness of about 10.0 ($\mu m$) by use of the electrolytic plating method. Meanwhile, the Al wiring layer is formed to have a thickness of about 2.0 to 3.0 ($\mu m$) by use of the sputtering method. Specifically, by using the Cu plating layer 54 as the wiring layer, the thickness thereof also allows reduction in the wiring resistance value.

Note that FIG. 5B shows the case where the opening 56 is formed on the formation region of the pad electrode 43. However, this embodiment of the present invention is not limited to this case. This embodiment of the present invention may also be applied to the case where the Cu plating layer 54 is used as the wiring layer as described above, is extended to an arbitrary region and is connected to the bump electrode. In this case, by using the Cu plating layer 54, instead of the Al wiring layer, as the Cu wiring layer, the wiring resistance value is reduced.

As described above, in this embodiment, the plating metal layer 53 and the pad electrode 43 are connected to each other through the opening regions 45 to 48 formed in the second insulating layer 44. Moreover, the Cu plating layer 54 and the pad electrode 43 react with each other in areas indicated by circles 58 to 65 in the opening regions 45 to 48. Note that the areas indicated by the circles 58 to 65 in the opening regions 45 to 48 correspond to the areas indicated by the circles 35 and 36 in FIG. 2B.

Specifically, in this embodiment, the alloy layer that is a low-resistance area is formed by metal reaction in a boundary area between an inner wall of the second insulating layer 44 and the pad electrode 43 and in areas adjacent thereto in the opening regions 45 to 48. In the boundary area between the inner wall of the second insulating layer 44 and the pad electrode 43, the Cr layer is formed to have a thickness smaller than that in a central area of the bottom of each of the opening regions 45 to 48 by step coverage in the opening regions 45 to 48. In this area, deposition of the chromium layer is difficult.

With the structure described above, the Cr layer is set to be thinner than a predetermined thickness t2 in the areas indicated by the circles 58 to 65. Thus, quality of the Cr layer becomes coarse. Specifically, spaces between crystal grains in the Cr layer are widened to cause a portion having crystal grains present therein and a portion having no crystal grains present therein. In the area having coarse crystal grains, the Cu plating layer 54 buried in the opening regions 45 to 48 reacts with the pad electrode 43 made of an Al layer or an Al alloy layer. Moreover, as described above with reference to FIG. 3A, in the area having coarse crystal grains in the Cr layer, Cu and Al having affinities for each other flow between the crystal grains and react with each other. Accordingly, the Cr layer is ruptured by the alloy layer thus generated. This area where the alloy layer is formed serves as a current path. Thus, a resistance value between the pad electrode 43 and the Cu plating layer 54 is reduced.

Note that, also in this embodiment, as described with reference to FIG. 2A (not the same reference numerals), the resistance value between the pad electrode 43 and the Cu plating layer 54 is further reduced by forming the plurality of opening regions. Moreover, as shown in FIG. 3B, by forming the plating metal layer 53 having the desired thickness t2 in the opening regions 45 to 48, progressive property fluctuations due to the metal reaction between the Cu plating layer 54 and the pad electrode 43 can be suppressed. Besides the above, the same effects as those achieved in the first embodiment described with reference to FIGS. 1 to 4 can be achieved also in this embodiment.

Next, with reference to FIGS. 6 to 11, detailed description will be given of a method for manufacturing a semiconductor device according to a third embodiment of the present invention. FIGS. 6 to 11 are cross-sectional views showing the method for manufacturing a semiconductor device according to this embodiment. Note that, in this embodiment, since description will be given of the method for manufacturing the structure shown in FIG. 1A, the same constituent components as those in the structure are denoted by the same reference numerals.

Figure 6:
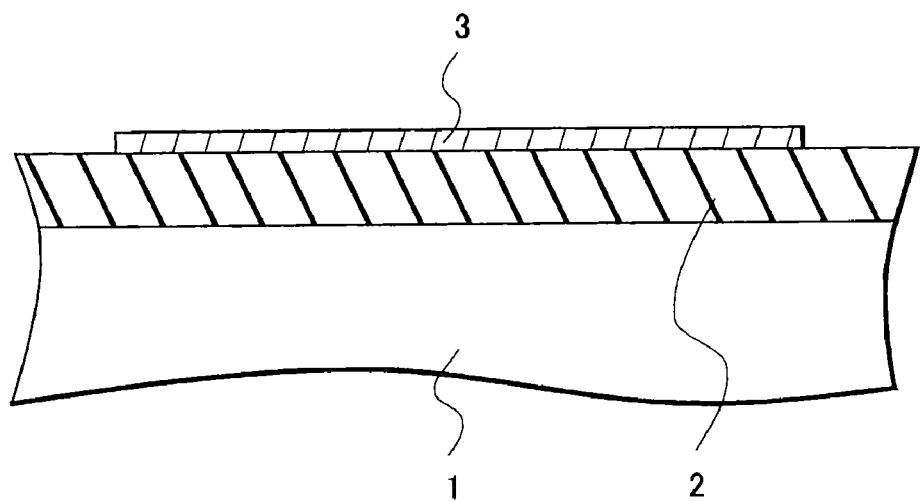
FIG. 6 is a cross-sectional view showing a method for manufacturing a semiconductor device according to an embodiment of the present invention.

First, as shown in FIG. 6, a silicon substrate (wafer) 1 is prepared, and a first insulating layer 2 is formed on the silicon substrate 1. Moreover, examples of the silicon substrate 1 include one made of a single crystal substrate and one having an epitaxial layer formed on a single crystal substrate. Furthermore, a compound semiconductor substrate may be used as the silicon substrate 1. As a matter of course, in the silicon substrate 1 (including an epitaxial layer if the epitaxial layer is formed), a semiconductor element is formed by a diffusion region. Moreover, the first insulating layer 2 is formed of at least a silicon oxide film, or an NSG film, or a BPSG film and the like by use of, for example, a thermal oxidation method or a CVD (Chemical Vapor Deposition) method.

Subsequently, a pad electrode 3 is formed on the first insulating layer 2. An Al layer or an alloy layer mainly made of Al, such as an Al—Si film, an Al—Si—Cu film and an Al—Cu film, is deposited on the silicon substrate 1 by use of, for example, a sputtering method. Thereafter, by use of a photolithography technology and an etching technology, the Al layer or the Al alloy layer is selectively removed to form the pad electrode 3.

Note that, when the Al layer or the Al alloy layer is patterned to form the pad electrode, patterning may be performed after Ti and TiN (not shown) are laminated in this order on the Al layer or the Al alloy layer.

Figure 7:
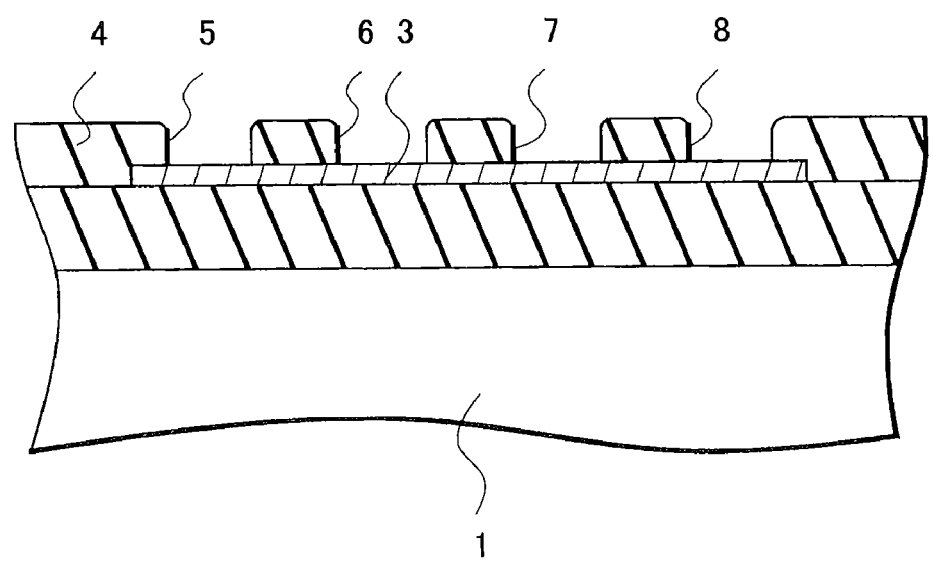
FIG. 7 is a cross-sectional view showing the method for manufacturing a semiconductor device according to the embodiment of the present invention.

Next, as shown in FIG. 7, a second insulating layer 4 is formed on the silicon substrate 1 and also on the pad electrode 3. As the second insulating layer 4, a silicon oxide film, a TEOS film or the like is formed by use of the CVD method, for example. Thereafter, opening regions 5 to 8 are formed in the second insulating layer 4 on the pad electrode 3 by use of the photolithography technology and the etching technology. The opening regions 5 to 8 are formed in a checkered pattern (see FIG. 2A) on the pad electrode 3 by dry etching using $CHF_3$ or $CF_4$ gas, for example.

Figure 8:
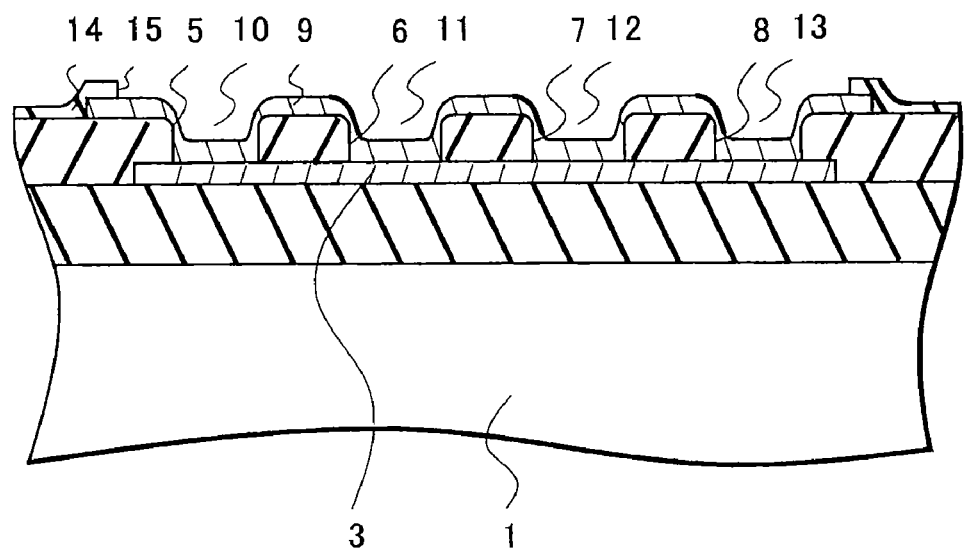
FIG. 8 is a cross-sectional view showing the method for manufacturing a semiconductor device according to the embodiment of the present invention.

Thereafter, as shown in FIG. 8, an Al layer or an alloy layer mainly made of Al, such as, an Al—Si film, an Al—Si—Cu film and an Al—Cu film, is deposited on the silicon substrate 1 by use of, for example, the sputtering method so as to be connected to the pad electrode 3 through the opening regions 5 to 8. Thereafter, by use of the photolithography technology and the etching technology, the Al layer or the Al alloy layer is selectively removed to form a metal layer 9. In this event, the metal layer 9 is formed so as to cover insides of the opening regions 5 to 8 on the pad electrode 3. Subsequently, in the metal layer 9 on the pad electrode 3, a plurality of concave portions 10 to 13 are formed so as to trace the opening regions formed in the second insulating layer 4.

Note that, if necessary, a barrier film may be formed by laminating Ti and TiN in this order below the metal layer 9 made of the Al layer or the Al alloy layer.

Thereafter, a SiN film is deposited on the silicon substrate 1 by use of, for example, a plasma CVD method. Subsequently, by use of the photolithography technology and the etching technology, an opening 15 is formed in the SiN film on the pad electrode 3, and a shield layer 14 is formed. Instead of the SiN film, a resin film made of polyimide or the like may be used.

Note that the metal layer 9 is used as an island-shaped electrode and is integrally formed as a wiring layer. Moreover, the metal layer 9 is formed in the same step as an uppermost wiring layer.

For example, in the case where a two-layer wiring structure is formed, a first wiring layer and the pad electrode 3 are formed in the same step, and a second wiring layer and the metal layer 9 are formed in the same step.

Moreover, in the case where a four-layer wiring structure is formed, a third wiring layer and the pad electrode 3 are formed in the same step, and a fourth wiring layer and the metal layer 9 are formed in the same step.

Figure 9:
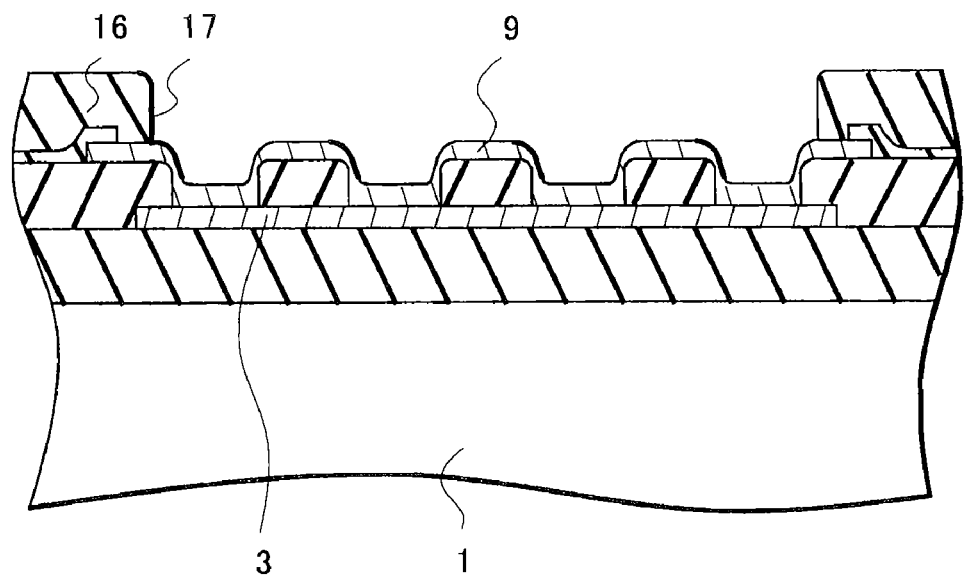
FIG. 9 is a cross-sectional view showing the method for manufacturing a semiconductor device according to the embodiment of the present invention.

Next, as shown in FIG. 9, a spin-coated resin film 16 is formed on the silicon substrate 1 by use of, for example, a spin-coating method. As a material thereof, a PBO film, a polyimide resin film or the like is used. Thereafter, by use of the photolithography technology and the etching technology, an opening 17 is formed in the spin-coated resin film 16 on the pad electrode 3. The metal layer 9 is exposed from the opening 17. Note that an oxide film having a thickness of, for example, about 3 (nm) is formed on the pad electrode 3 by the step of forming the opening 17 in the spin-coated resin film 16.

Figure 10:
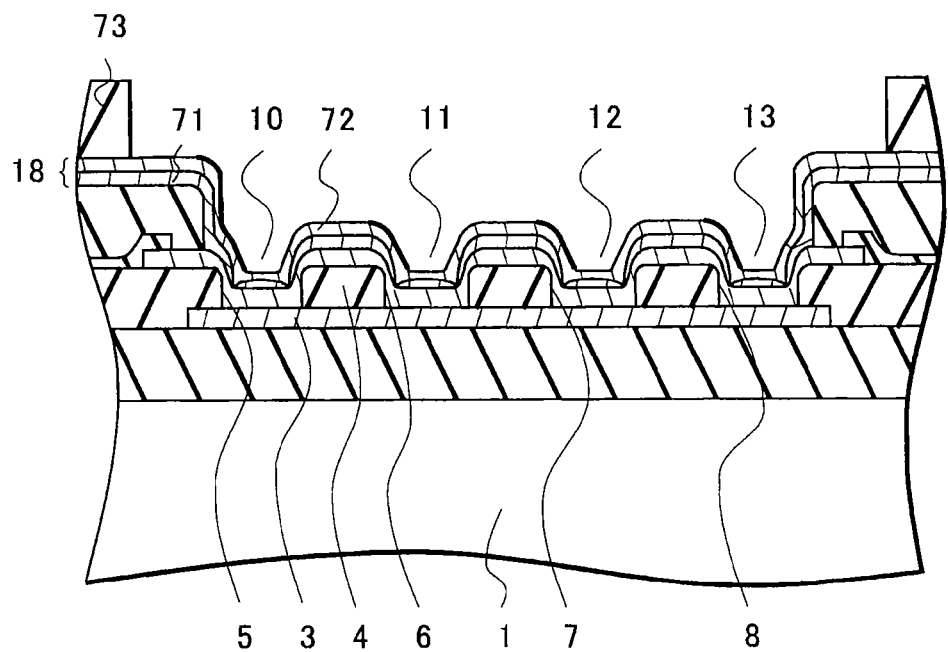
FIG. 10 is a cross-sectional view showing the method for manufacturing a semiconductor device according to the embodiment of the present invention.

Thereafter, as shown in FIG. 10, a Cr layer 71 and a Cu layer 72 are deposited on the entire surface of the silicon substrate 1 by use of, for example, the sputtering method. Subsequently, by use of the Cr layer 71 as a plating metal layer 18, for example, adhesion between the PBO film and a Cu plating layer 19 (see FIG. 11) can be improved.

Furthermore, on a formation region of the pad electrode 3, the opening regions 5 to 8 are formed in the second insulating layer 4 and the concave portions 10 to 13 are formed in the metal layer 9. As described with reference to FIG. 2B, step coverage attributable to the concave portions 10 to 13 generates an area where the Cr layer 71 is thinly formed in a peripheral portion at a bottom of each of the concave portions 10 to 13 and in areas adjacent thereto.

Subsequently, here, for patterning of the Cu plating layer 19 by lift-off, a photoresist layer 73 is formed in a portion other than a formation region of the Cu plating layer 19.

Figure 11:
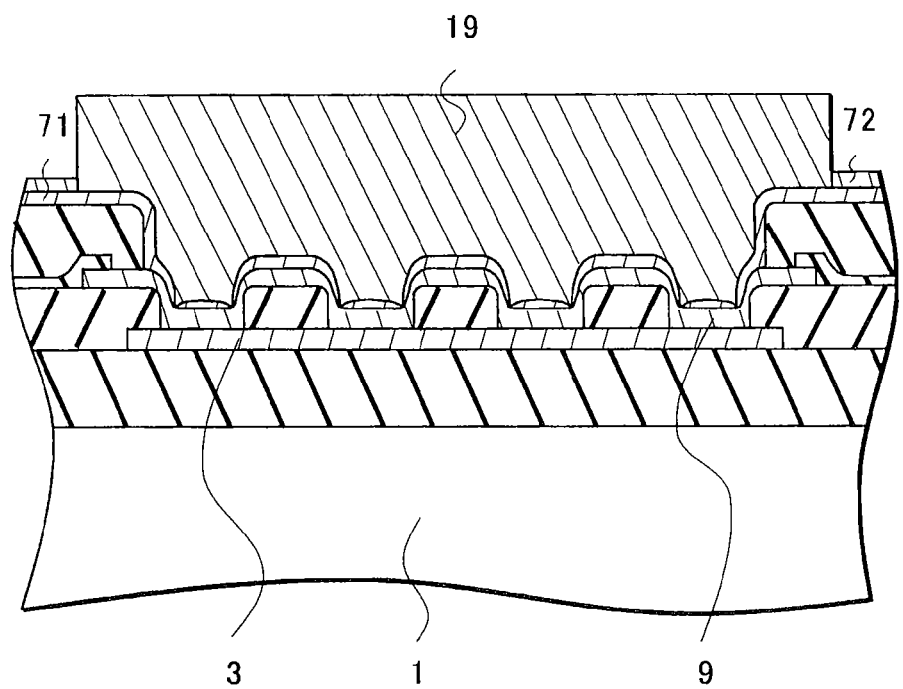
FIG. 11 is a cross-sectional view showing the method for manufacturing a semiconductor device according to the embodiment of the present invention.

Next, as shown in FIG. 11, the Cu plating layer 19 is formed by use of an electrolytic plating method. As described above, the Cr layer 71 is used as a seed layer and the Cu layer 72 is used as a seed in performing the electrolytic plating.

Subsequently, by removing the photoresist layer 73 described above, the Cu plating layer 19 on the Cr layer 71 and the Cu layer 72 is patterned. Furthermore, the Cu plating layer 19 is used as a mask to selectively remove the Cr layer 71 and the Cu layer 72 by wet etching. Thus, the structure shown in FIG. 1A is completed.

Thereafter, although not shown in the drawings, in the area where the Cr layer 71 is thinly formed, the Cu plating layer 19 as an upper layer and the metal layer 9 as a lower layer react with each other through heat treatment in a step of forming a bump electrode 22 (see FIG. 1B) or the like. Thus, an alloy layer including at least Cu and Al is formed.

Although not for sure, the metal reaction is progressed also when the Cu layer 72 as the plating metal layer 18 is formed by use of the sputtering method. Thus, the alloy layer described above seems to be formed. Therefore, in this case, it seems that the alloy layer is formed by the metal reaction through the heat treatment in formation of the bump electrode 22 or that growth of the alloy layer formed in formation of the Cu layer 72 is facilitated.

Note that the Cu plating layer 19 is formed on the plating metal layer 18 by use of the electrolytic plating method. However, the Cu layer 72 is substantially replaced by the Cu plating layer 19. Therefore, the Cu layer is shown as being integrated with the Cu plating layer, and only the Cr layer 71 is shown.

In this embodiment, the description was given of the case where the wafer is prepared and the first insulating layer 2, the second insulating layer 4, the pad electrode 3, the opening regions 5 to 8, the metal layer 9, the concave portions 10 to 13 and the shield layer 14 are formed on the wafer. However, this embodiment of the present invention is not limited to the above case. For example, this embodiment of the present invention may also be applied to the case where a wafer is prepared in a state where the first insulating layer 2, the second insulating layer 4, the pad electrode 3, the opening regions 5 to 8, the metal layer 9, the concave portions 10 to 13 and the shield layer 14 are formed, and the spin-coated resin film 16, the opening 17, the plating metal layer 18, the Cu plating layer 19, the bump electrode 22 and the like are formed on the wafer.

Moreover, in this embodiment, the description was given of the case where, as the plating metal layer 18, the Cu layer 72 is deposited on the Cr layer 71 (see FIG. 10). However, this embodiment of the present invention is not limited to the above case. For example, as the plating metal layer 18, a Ti layer or a TiW layer may be used instead of the Cr layer 71 and a Ni layer may be formed instead of the Cu layer 72. Moreover, when the Ni layer is used, an Au plating layer may be formed, instead of the Cu plating layer, on the Ni layer. Besides the above, various changes can be made without departing from the scope of the present invention.

Next, with reference to FIGS. 12 to 17, detailed description will be given of a method for manufacturing a semiconductor device according to a fourth embodiment of the present invention. FIGS. 12 to 17 are cross-sectional views showing the method for manufacturing a semiconductor device according to this embodiment. Note that, in this embodiment, since description will be given of a method for manufacturing the structure shown in FIG. 5A, the same constituent components as those in the structure are denoted by the same reference numerals.

Figure 12:
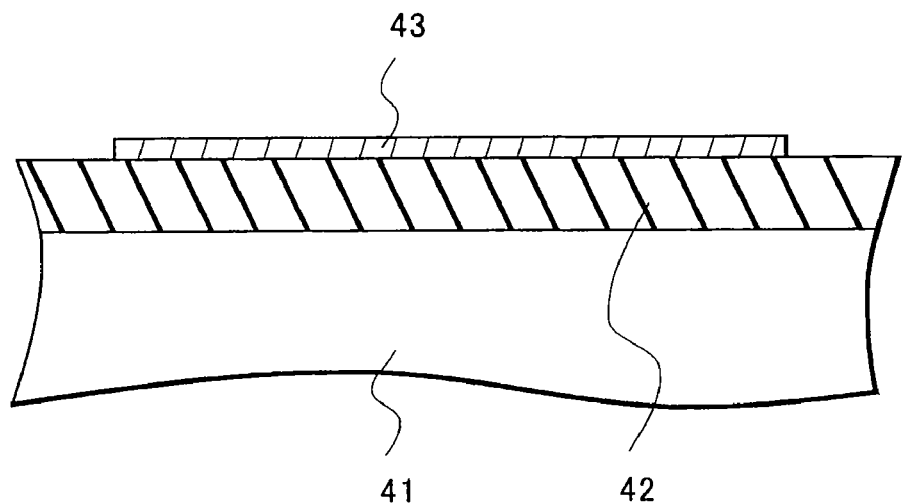
FIG. 12 is a cross-sectional view showing the method for manufacturing a semiconductor device according to the embodiment of the present invention.

First, as shown in FIG. 12, a silicon substrate (wafer) 41 is prepared, and a first insulating layer 42 is formed on the silicon substrate 41. Moreover, examples of the silicon substrate 41 include one made of a single crystal substrate and one having an epitaxial layer formed on a single crystal substrate. Furthermore, a compound semiconductor substrate may be used as the silicon substrate 41. As a matter of course, in the silicon substrate 41 (including an epitaxial layer if the epitaxial layer is formed), a semiconductor element is formed by a diffusion region. Moreover, the first insulating layer 42 is formed of at least a silicon oxide film, or an NSG film, or a BPSG film and the like by use of, for example, a thermal oxidation method or a CVD method.

Subsequently, a pad electrode 43 is formed on the first insulating layer 42. An Al layer or an alloy layer mainly made of Al, such as an Al—Si film, an Al—Si—Cu film and an Al—Cu film, is deposited on the silicon substrate 41 by use of, for example, a sputtering method. Thereafter, by use of a photolithography technology and an etching technology, the Al layer or the Al alloy layer is selectively removed to form the pad electrode 43.

Note that, when the Al layer or the Al alloy layer is patterned to form the pad electrode, patterning may be performed after Ti and TiN (not shown) are laminated in this order on the Al layer or the Al alloy layer.

Figure 13:
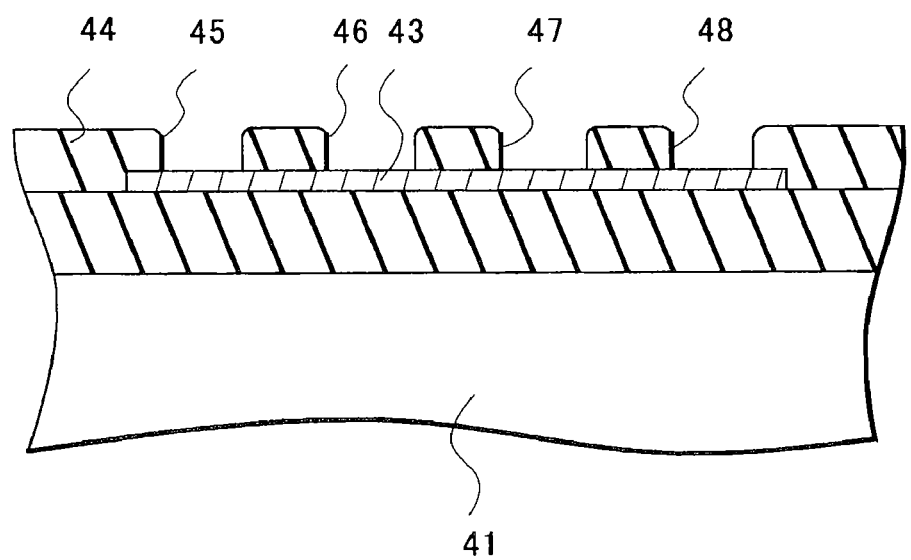
FIG. 13 is a cross-sectional view showing the method for manufacturing a semiconductor device according to the embodiment of the present invention.

Next, as shown in FIG. 13, a second insulating layer 44 is formed on the silicon substrate 41 and also on the pad electrode 43. As the second insulating layer 44, a silicon oxide film, a TEOS film or the like is formed by use of the CVD method, for example. Thereafter, opening regions 45 to 48 are formed in the second insulating layer 44 on the pad electrode 43 by use of the photolithography technology and the etching technology. The opening regions 45 to 48 are formed in a checkered pattern (see FIG. 2A (not the same reference numeral)) on the pad electrode 43 by dry etching using CHF$_3$ or CF$_4$ gas, for example. Note that an oxide film having a thickness of, for example, about 3 (nm) is formed on the pad electrode 43 by the step of forming the opening regions 45 to 48 in the second insulating layer 44.

Figure 14:
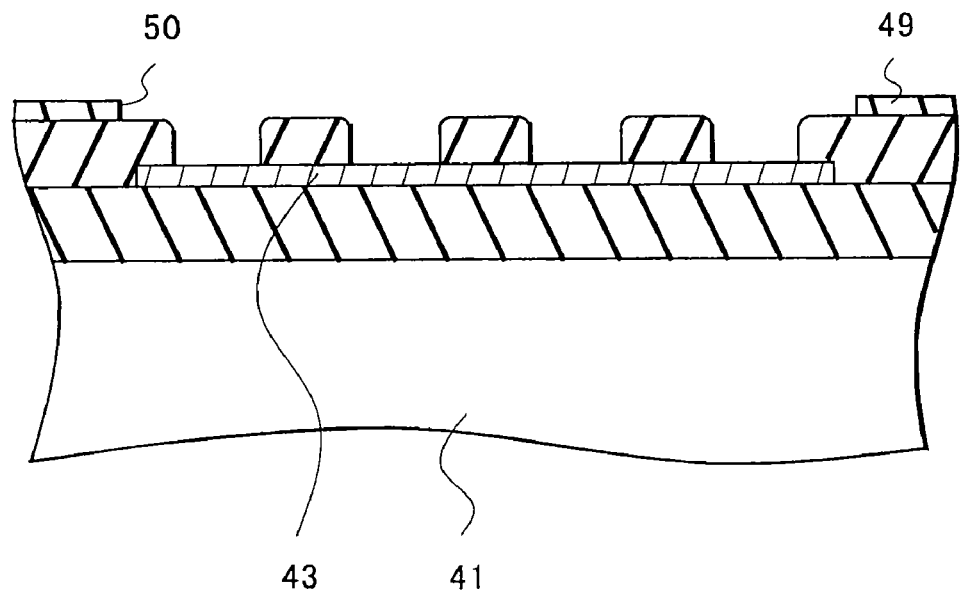
FIG. 14 is a cross-sectional view showing the method for manufacturing a semiconductor device according to the embodiment of the present invention.

Thereafter, as shown in FIG. 14, a SiN film is deposited on the silicon substrate 41 by use of, for example, a plasma CVD method. Subsequently, by use of the photolithography technology and the etching technology, an opening 50 is formed in the SiN film on the pad electrode 43, and a shield layer 49 is formed. Instead of the SiN film, a resin film made of polyimide or the like may be used.

Figure 15:
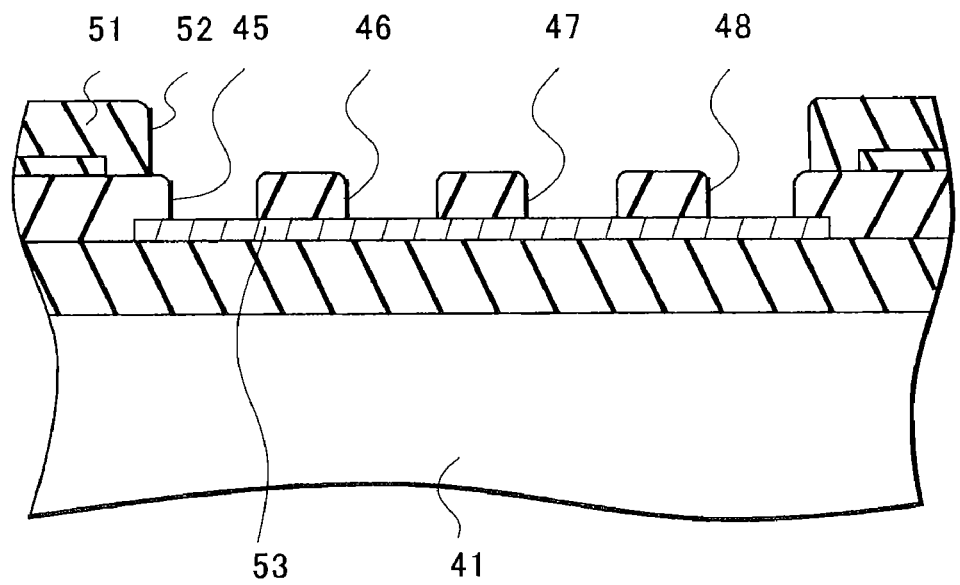
FIG. 15 is a cross-sectional view showing the method for manufacturing a semiconductor device according to the embodiment of the present invention.

Next, as shown in FIG. 15, a spin-coated resin film 51 is formed on the silicon substrate 41 by use of, for example, a spin-coating method. As a material thereof, a PBO film, a polyimide resin film or the like is used. Thereafter, by use of the photolithography technology and the etching technology, an opening 52 is formed in the spin-coated resin film 51 on the pad electrode 43. The pad electrode 43 is exposed from the opening 52 through the opening regions 45 to 48.

Figure 16:
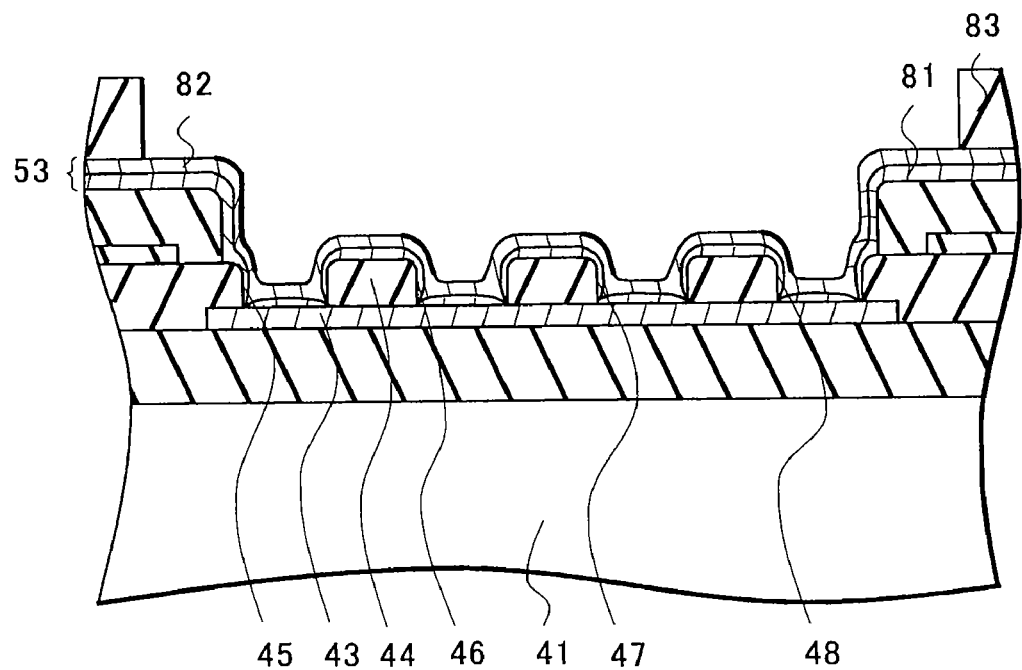
FIG. 16 is a cross-sectional view showing the method for manufacturing a semiconductor device according to the embodiment of the present invention.

Thereafter, as shown in FIG. 16, a Cr layer 81 and a Cu layer 82 are deposited on the entire surface of the silicon substrate 41 by use of, for example, the sputtering method. Subsequently, by use of the Cr layer 81 as a plating metal layer 53, for example, adhesion between the PBO film and a Cu plating layer 54 (see FIG. 17) can be improved.

Furthermore, on a formation region of the pad electrode 43, the opening regions 45 to 48 are formed in the second insulating layer 44 and step coverage attributable to the opening regions 45 to 48 generates an area where the Cr layer 81 is thinly formed in a peripheral portion at a bottom of each of the opening regions 45 to 48 and in areas adjacent thereto.

Subsequently, here, for patterning of the Cu plating layer 54 by lift-off, a photoresist layer 83 is formed in a portion other than a formation region of the Cu plating layer 54.

Figure 17:
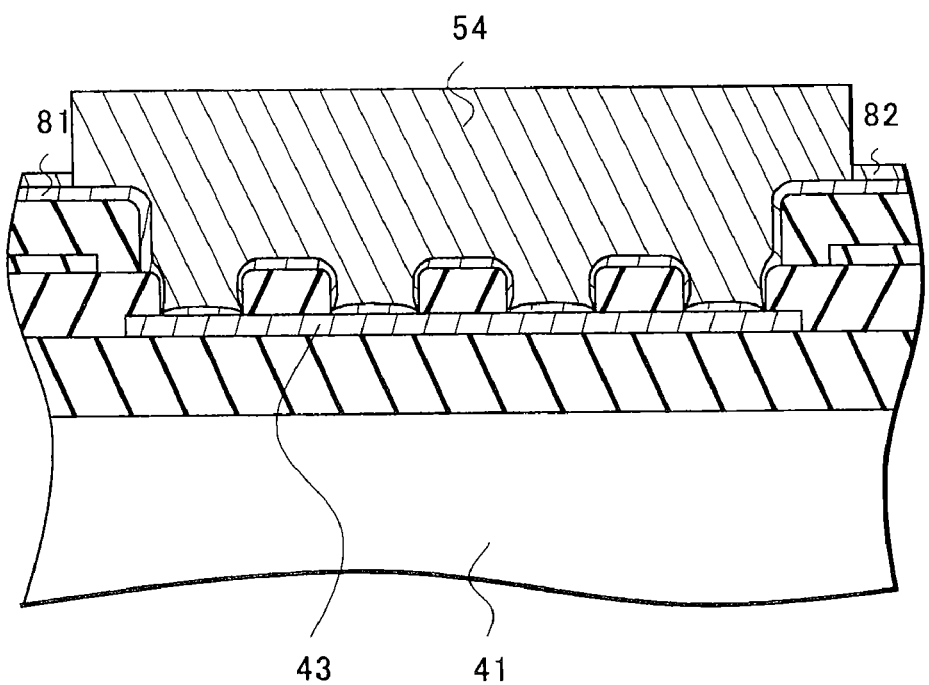
FIG. 17 is a cross-sectional view showing the method for manufacturing a semiconductor device according to the embodiment of the present invention.

Next, as shown in FIG. 17, the Cu plating layer 54 is formed by use of an electrolytic plating method. As described above, the Cr layer 81 is used as a seed layer and the Cu layer 82 is used as a seed in performing the electrolytic plating.

Subsequently, by removing the photoresist layer 83 described above, the Cu plating layer 54 on the Cr layer 81 and the Cu layer 82 is patterned. Furthermore, the Cu plating layer 54 is used as a mask to selectively remove the Cr layer 81 and the Cu layer 82 by wet etching. Thus, the structure shown in FIG. 5A is completed.

Thereafter, although not shown in the drawings, in the area where the Cr layer 81 is thinly formed, the Cu plating layer 54 as an upper layer and the pad electrode 43 as a lower layer react with each other through heat treatment in a step of forming a bump electrode 57 (see FIG. 5B) or the like. Thus, an alloy layer including at least Cu and Al is formed.

Although not for sure, the metal reaction is progressed also when the Cu layer 82 as the plating metal layer 54 is formed by use of the sputtering method. Thus, the alloy layer described above seems to be formed. Therefore, in this case, it seems that the alloy layer is formed by the metal reaction through the heat treatment in formation of the bump electrode 57 or that growth of the alloy layer formed in formation of the Cu layer 82 is facilitated.

Note that the Cu plating layer 54 is formed on the plating metal layer 53 by use of the electrolytic plating method. However, the Cu layer 82 is substantially replaced by the Cu plating layer 54. Therefore, the Cu layer is shown as being integrated with the Cu plating layer, and only the Cr layer 81 is shown.

In this embodiment, the description was given of the case where the wafer is prepared and the first insulating layer 42, the second insulating layer 44, the pad electrode 43, the opening regions 45 to 48 and the shield layer 49 are formed on the wafer. However, this embodiment of the present invention is not limited to the above case. For example, this embodiment of the present invention may also be applied to the case where a wafer is prepared in a state where the first insulating layer 42, the second insulating layer 44, the pad electrode 43, the opening regions 45 to 48 and the shield layer 49 are formed, and the spin-coated resin film 51, the opening 52, the plating metal layer 53, the Cu plating layer 54, the bump electrode 57 and the like are formed on the wafer.

Moreover, in this embodiment, the description was given of the case where, as the plating metal layer 53, the Cu layer 82 is deposited on the Cr layer 81 (see FIG. 16). However, this embodiment of the present invention is not limited to the above case. For example, as the plating metal layer 53, a Ti layer or a TiW layer may be used instead of the Cr layer 81 and a Ni layer may be formed instead of the Cu layer 82. Moreover, when the Ni layer is used, an Au plating layer may be formed, instead of the Cu plating layer, on the Ni layer. Besides the above, various changes can be made without departing from the scope of the present invention.

In this embodiment of the present invention, a metal layer having unevenness is formed on a pad electrode, and a plating metal layer and an electrode are formed on the metal layer. In concave portions of the metal layer, step coverage in the concave portions is utilized to form an alloy layer of the metal layer and the electrode. Thus, a resistance value on the pad electrode is reduced.

Moreover, in this embodiment of the present invention, the step coverage in the concave portions of the metal layer is utilized to form an alloy layer in a peripheral portion at a bottom of the concave portion. An area in which the alloy layer is formed serves as a current path. Thus, the resistance value on the pad electrode is reduced.

Moreover, in this embodiment of the present invention, formation of opening regions with poor step coverage in an insulating layer on the pad electrode also deteriorates the step coverage in the concave portions of the metal layer on the insulating layer. In the concave portions of the metal layer, an alloy layer that is a low-resistance area is easily formed.

Moreover, in this embodiment of the present invention, by using a chromium layer as the plating metal layer, adhesion between a polybenzoxazole film and the electrode is improved.

Moreover, in this embodiment of the present invention, use of the polybenzoxazole film or a polyimide resin film as the spin-coated resin film prevents deterioration in a semiconductor element due to an external environment such as moisture.

Moreover, in this embodiment of the present invention, the alloy layer is formed by metal reaction between an aluminum layer or an aluminum alloy layer and a copper layer. Both the metal layers have affinities for each other and easily react with each other in a coarse area of the chromium layer. Thus, the resistance value on the pad electrode is reduced.

Moreover, in this embodiment of the present invention, the step coverage in the opening regions is utilized also in the structure in which the pad electrode and the plating metal layer are connected to each other through the opening regions in the insulating layer. Thus, the resistance value on the pad electrode is reduced.

Moreover, in this embodiment of the present invention, the metal layer is formed after a plurality of opening regions are formed in the insulating layer on the pad electrode. In the metal layer on the opening regions, a plurality of concave portions are formed. By utilizing the step coverage in the concave portions, the resistance value on the pad electrode is reduced.

Moreover, in this embodiment of the present invention, a plurality of opening regions are formed in the insulating layer on the pad electrode, and the plating metal layer and the electrode are formed through the opening regions. By utilizing the step coverage in the opening regions, the resistance value on the pad electrode is reduced.

What is claimed is:

1. A semiconductor device comprising: a pad electrode formed on a semiconductor substrate; an insulating layer formed on the semiconductor substrate so as to cover the pad electrode and having a plurality of openings over the pad electrode; a metal layer formed on the insulating layer so as to be connected to the pad electrode through the openings, the metal layer not filling the openings fully so as to form a concave portion at each of the openings; a plating metal layer formed on the metal layer so that a portion of the plating metal layer disposed in each of the concave portions becomes thinner than other portions of the plating metal layer; and an electrode formed on the plating metal layer so that part of the electrode and part of the metal layer are alloyed through the thinner portion of the plating metal layer, wherein the plating metal layer comprises chromium, the plating metal layer has an area without crystal grains in the thinner portion, and a chromium alloy is formed in the area without crystal grains.

2. The semiconductor device of claim 1, wherein the thinner portion is located at a bottom corner of a corresponding concave portion.

3. The semiconductor device of claim 2, wherein each of the openings is formed so that an angle between a sidewall of the opening and the pad electrode covered by the insulating layer is 70° to 90°.

4. The semiconductor device of claim 1, wherein the metal layer comprises aluminum or an aluminum alloy, and the electrode comprises a copper layer and a bump electrode formed on the copper layer.

5. The semiconductor device of claim 1, further comprising a spin-coated resin film formed on the metal layer and having an opening in which the concave portions are located.

6. The semiconductor device of claim 5, wherein the spin-coated resin film comprises a polybenzoxazole or a polyimide resin.

7. A semiconductor device comprising: a pad electrode formed on a semiconductor substrate;
an insulating layer formed on the semiconductor substrate so as to cover the pad electrode and having a plurality of openings over the pad electrode;
a plating metal layer formed on the insulating layer so as to be connected to the pad electrode through the openings, a portion of the plating metal layer disposed in each of the openings being thinner than other portions of the plating metal layer; and
an electrode formed on the plating metal layer so that part of the electrode and part of the pad electrode are alloyed through the thinner portion of the plating metal layer, wherein the plating metal layer comprises chromium, the plating metal layer has an area without crystal grains in the thinner portion, and a chromium alloy is formed in the area without crystal grains.

8. The semiconductor device of claim 7, wherein the thinner portion is located at a bottom corner of a corresponding opening.

9. The semiconductor device of claim 8, wherein each of the openings is formed so that an angle between a sidewall of the opening and the pad electrode covered by the insulating layer is 70° to 90°.

10. The semiconductor device of claim 7, wherein the pad electrode comprises aluminum or an aluminum alloy, and the electrode comprises a copper layer and a bump electrode formed on the copper layer.

11. The semiconductor device of claim 7, further comprising a spin-coated resin film formed on the metal layer and having an opening in which the openings of the insulating layer are located.

12. The semiconductor device of claim 11, wherein the spin-coated resin film comprises a polybenzoxazole or a polyimide resin.

* * * * *